(12) United States Patent
Bui (10) Patent No.: US 6,597,199 B1
(45) Date of Patent: *Jul. 22, 2003

(54) METHOD AND CIRCUIT FOR LOGIC OUTPUT BUFFER

(75) Inventor: John Henry Bui, San Jose, CA (US)

(73) Assignee: Winbond Electronics Corporation, Hsin Chu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 647 days.

(21) Appl. No.: 09/205,257

(22) Filed: Dec. 2, 1998

(51) Int. Cl.[7] .......................................... H03K 19/0175
(52) U.S. Cl. ............................. 326/83; 326/86; 326/87; 326/17; 326/119; 326/121; 327/170
(58) Field of Search ............................. 326/83, 85, 86, 326/87, 81, 121, 119, 17; 327/170

(56) References Cited

U.S. PATENT DOCUMENTS

| | | | | | |
|---|---|---|---|---|---|
| 5,594,361 A | * | 1/1997 | Campbell | .................... | 326/24 |
| 5,604,453 A | * | 2/1997 | Pedersen | .................... | 327/112 |
| 5,672,983 A | * | 9/1997 | Yamamoto et al. | ........... | 326/27 |
| 5,760,620 A | * | 6/1998 | Doluca | ........................ | 327/112 |
| 5,949,259 A | * | 9/1999 | Garcia | ........................ | 327/111 |

* cited by examiner

Primary Examiner—Michael Tokar
Assistant Examiner—Vibol Tan
(74) Attorney, Agent, or Firm—Dinh & Associates

(57) ABSTRACT

An output buffer having one or more of the following advantages: (1) faster slew rate, (2) reduced switching noise during signal transitions, and (3) improved switching time. The output buffer includes a pair of output transistors. At least one of the output transistors is designed with dynamically adjustable beta that allows for robust control of the output buffer operating characteristics. The beta can be adjusted by changing the size of the output transistor. Transistor size can be changed, in turn, by enabling and disabling additional output transistor(s).

29 Claims, 4 Drawing Sheets

PRIOR ART

METHOD AND CIRCUIT FOR LOGIC OUTPUT BUFFER

BACKGROUND OF THE INVENTION

This invention relates generally to a digital logic circuit, and more particularly to a logic output buffer and related circuitry.

Digital logic circuits are used for various electronic applications such as microprocessors, controllers, digital signal processors, memory devices, and so on. Digital logic circuits can be classified into three popular logic families: (1) transistor-transistor logic (TTL), (2) emitter-coupled logic (ECL), and complementary metal-oxide-semiconductor (CMOS). Because of their low dissipation power, compact design, and noise immunity, CMOS logic circuits offer advantages over circuits of other logic families.

For a digital logic circuit, each output signal is typically driven by a logic output buffer. The output buffer is designed to provide greater drive capability than that of the internal circuits. This additional drive capability is required because of the load capacitance and impedance associated with each output line. Generally, higher output current is required to drive more load capacitance.

The drive capability of the output buffer is measured by its slew rate, or its ability to quickly charge or discharge an output line. Faster slew rate can be obtained by increasing the switching speed of the output buffer and also by providing the output buffer with greater drive current. However, both of these characteristics also result in greater switching noise during signal transitions. A circuit designer facing these conflicting design requirements must compromise between enhancing drive capability and reducing switching noise.

Figure 1:
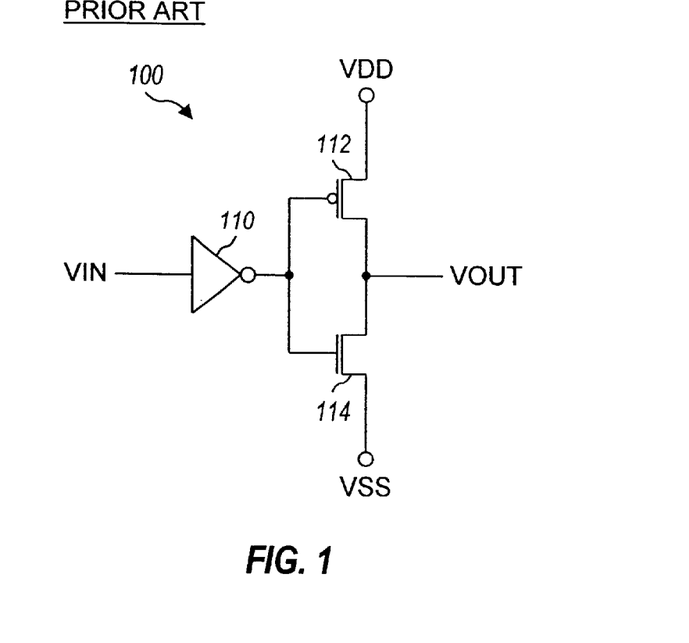
FIGS. 1 is a simplified schematic diagram of a conventional non-inverting CMOS output buffer.

FIG. 1 is a simplified schematic of a conventional non-inverting CMOS output buffer 100. Output buffer 100 includes an inverting buffer 110 and two output transistors, a P-channel transistor 112 and an N-channel transistor 114, coupled in series. Transistors 112 and 114 are metal-oxide-semiconductor (MOS) enhancement mode devices. The input signal (vin) couples to the input of a buffer 110. The output of buffer 110 couples to the gates of transistors 112 and 114. The source of P-channel transistor 112 couples to an upper power supply (VDD) and the source of N-channel transistor 114 couples to a lower power supply (VSS). The drains of both transistors 112 and 114 couple together and form the output of buffer 100.

Usually, by selecting the proper betas for the output transistors and the ratio of the transistor betas, a circuit designer can obtain certain circuit characteristics. The betas, in turn, can be controlled by properly sizing the transistors. For a conventional output buffer, the degree of control is limited and a sub-optimal circuit design is typically produced.

SUMMARY OF THE INVENTION

The invention provides a logic output buffer having one or more of the following advantages: (1) faster slew rate, (2) reduced switching noise during signal transitions, (3) improved switching time, and others advantages. The output buffer includes a pair of output transistors. At least one of the output transistors is designed with dynamically adjustable beta that allows for robust control of the output buffer operating characteristics. The beta can be adjusted by changing the size of the output transistor. The transistor size can be changed by enabling and disabling additional output transistor(s).

In a specific embodiment, the output buffer includes a pair of MOS output transistors, a P-channel transistor and an N-channel transistor, coupled in series and to respective supply sources. An additional P-channel output transistor is coupled in series with a control transistor, the combination of which is coupled in parallel with the P-channel output transistor. The additional output transistor is selectively enabled, through the control transistor, prior to rising transitions at the output of the buffer. The additional output transistor provides at least some of the advantages described above.

In another specific embodiment, the output buffer includes a pair of MOS output transistors coupled as in the above embodiment. An additional N-channel output transistor is coupled in series with a control transistor, the combination of which is coupled in parallel with the N-channel output transistor. The additional output transistor is selectively enabled to provide at least some of the aforementioned advantages.

In yet another specific embodiment, the output buffer includes a pair of MOS output transistors coupled as in the above embodiment. Two additional output transistors, one P-channel and one N-channel, are provided. Each additional output transistor couples in series with a control transistor, the combination of which is coupled in parallel with the similar channel type output transistor. The additional output transistors are selectively enabled to provide at least some of the aforementioned advantages.

A control circuit is used to generate the control signal to enable and disable the additional output transistor(s). The control circuit can be designed to accept either the input signal (Vin) or the output signal (Vout) of the output buffer to which the control circuit couples.

Additional embodiments can be designed using the inventive concept described herein. For example, one or more "enable" transistors can be provided to activate and deactivate the output buffer.

The foregoing, together with other aspects of this invention, will become more apparent when referring to the following specification, claims, and accompanying drawings.

DESCRIPTION OF SPECIFIC EMBODIMENTS

Figure 2:
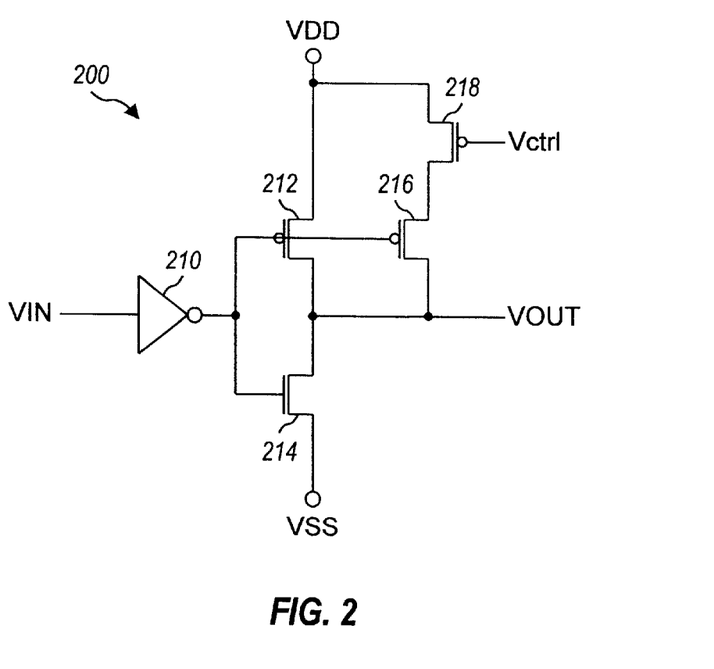
FIGS. 2 is a simplified schematic diagram of an embodiment of an output buffer of the invention.

FIG. 2 shows a simplified schematic of an embodiment of a non-inverting CMOS output buffer 200. Output buffer 200 includes an inverting buffer 210 and a pair of output transistors 212 and 214 coupled in series and to supply sources VDD and VSS, respectively. This configuration is similar to that shown in FIG. 1. However, this embodiment includes an additional P-channel output transistor 216 having its gate and drain coupled to the gate and drain, respectively, of transistor 212. The source of transistor 216 couples to the drain of a P-channel control transistor 218, and the source of control transistor 218 couples to the supply source VDD.

Transistor 214 performs the function of transistor 114 in FIG. 1, and transistors 212 and 216 perform the function of transistor 112. However, transistor 216 is selectively enabled, through a control signal (Vctrl) on control transistor 218, to provide the desired circuit characteristics. The generation of the control signal (Vctrl) is described below.

Generally, the beta of a transistor determines its operating characteristics. A circuit designer selects the betas of the P-channel and the N-channel transistors, and the ratio of the transistor betas, such that the most favorable characteristics are obtained (e.g., fast slew rate, reduced switching current, improved operating speed, and so on). Beta is related to transistor size, and bigger transistor size corresponds to higher beta. Specifically, beta is proportional to the ratio of the channel width over the channel length, or $\beta \infty$ W/L. The ratio of the betas ($\beta_P/\beta_N$) determines the output characteristics.

Generally, faster rise time can be obtained by increasing $\beta_P$, faster fall time can be obtained by increasing $\beta_N$, and the ratio $\beta_P/\beta_N$ determines the trip point. However, since the rise and fall times are relatively fast for an output buffer, the trip point is typically not as important as other design considerations. In accordance with the invention, the beta of at least one of the output transistors is dynamically adjusted to provide the desired performance.

Transistor 216, when enabled, operates in parallel with transistor 212 and provides a larger combined P-channel transistor size, thereby resulting in a higher beta. When transistor 216 is disabled, only transistor 212 is operational and provides a smaller P-channel transistor size, thereby resulting in a lower beta. The ability to dynamically adjust the beta of the output transistor provides many advantages.

First, the slew rate can be improved by the invention. A faster slew rate is achieved by enabling transistor 216 prior to a logic low to high (rising) transition ($V_{OLH}$) at the output of buffer 200. Prior to the rising transition, control transistor 218 is turned "on" since the control signal (Vctrl) is low. Transistor 216 is thus enabled and operates in parallel with transistor 212 to provide a larger transistor size, resulting in a higher drive capability. Alternatively, transistor 216 is disabled prior to a logic high to low (falling) transition ($V_{OHL}$) at the output of buffer 200. Prior to the falling transition, control transistor 218 is turned "off" since the control signal (Vctrl) is high. Transistor 216 is thus disabled and transistor 212 operates alone, thereby providing a smaller transistor size and correspondingly lower drive capability. The additional output transistor 216 is enabled or disabled prior to the corresponding signal transition at the output.

Second, the cross current can be reduced during output signal transitions which results in less switching noise in output buffer 200. Cross current is the current flowing across the P-channel and N-channel output transistors during a transition region where both transistors conduct. P-channel transistor 212 and N-channel transistor 214 have complementary characteristics (i.e., their output current ($I_{DS}$) versus input voltage ($V_{GS}$) transfer curves are complementary), and only one transistor typically conducts at any given moment. However, during transitions between logic levels, both transistors can conduct simultaneously (albeit momentarily) as the output signal passes through the transition region.

For an enhancement mode transistor, if the input voltage ($V_{GS}$) is greater than the transistor threshold voltage ($V_{TH}$), the transistor is turned "on" and operates as a current source. If the supply voltage is greater than the sum of the absolute threshold voltages of the P-channel and N-channel transistors (e.g., (VDD-VSS)>$|V_{TH-P-Channel}|+|V_{TH-N-Channel}|$) then both transistors simultaneously conduct during a portion of the transition region. For example, if VDD=5.0V, VSS is ground, and the threshold voltages of the P-channel and N-channel transistors are −1.0V and 1.0V, respectively, then both transistors conduct when the input voltage is between 1.0V and 4.0V. The amount of current flowing across both transistors depends on the sizes of the transistors.

Generally, larger transistor size corresponds to higher "on" (and cross) current and higher switching noise during a signal transition. By disabling P-channel transistor 216 prior to a falling transition at the output of buffer 200, the amount of cross current is reduced, and switching noise is also reduced. Less switching noise results in a lower probability of false sensing in other circuits in proximity to output buffer 200. The amount of cross current can be controlled by proper selection of the transistor sizes.

Third, faster rise time can be obtained by the use of the invention. When additional output transistor 216 is enabled during ($V_{OLH}$) transitions, a larger P-channel transistor size is obtained. Since the N-channel transistor size is the same, the proportionally larger P-channel transistor size provides a faster rise time.

As an example, consider a design of conventional output buffer 100 wherein the size of P-channel transistor 112 is 12/2 and the size of N-channel transistor 114 is 70/2. The number in the numerator denotes the channel width and the number in the denominator denotes the channel length, with both numbers given in unit of micro meter (micron). To obtain a faster slew rate during rising transitions at the output of output buffer 200, the combined size of P-channel transistors 212 and 216 can be designed to be greater than 12/2 (e.g., size 8/2 for each of transistors 212 and 216). Additionally, less cross current is generated during falling transitions since transistor 216 is turned "off" and the remaining P-channel transistor 212 is smaller in size (8/2) than that of corresponding P-channel transistor 112 (12/8).

Furthermore, faster output rise time may be obtained by use of the invention. For the above example, the size of N-channel transistor 214 can be 35/2. P-channel transistors 212 and 216 (having a combined size of 16/2 in the above example) are then sized to pull proportionally less current in N-channel transistor 214 (size 35/2) during rising transitions, thereby resulting in a faster rise time than that of conventional output buffer 100 having a P-channel size of 12/2 and an N-channel size of 70/2.

In FIG. 2, P-channel transistor 216 is shown with its source coupled to control transistor 218. This topology is advantageous over a topology in which control transistor 218 is interposed between the drain of transistor 216 and the output of buffer 200. For improved high frequency AC performance, it is advantageous to couple the "static" transistor to the supply source. The control transistor 218 is switched and settled (i.e., "static") before output transistor 216 is switched.

Figure 3:
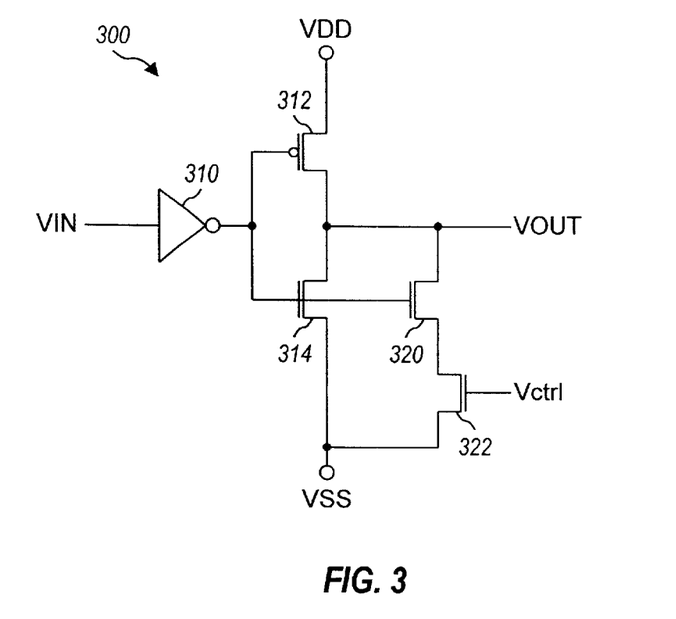
FIG. 3 is a simplified schematic diagram of another embodiment of an output buffer of the invention.

FIG. 3 shows a simplified schematic of another embodiment of a non-inverting CMOS output buffer 300. Output buffer 300 includes an inverting buffer 310 and a pair of output transistors 312 and 314 coupled in series and to supply sources VDD and VSS, respectively. This configuration is similar to that shown in FIG. 1. However, this embodiment includes an additional N-channel output transistor 320 having its gate and drain coupled to the gate and drain, respectively, of transistor 314. The source of transistor 320 couples to the drain of an N-channel control transistor 322 and the source of control transistor 322 couples to the supply source VSS.

Transistor 312 performs the function of transistor 112 in FIG. 1, and transistors 314 and 320 perform the function of transistor 114. However, transistor 320 is selectively enabled, through a control signal (Vctrl) coupled to the gate of control transistor 322, to provide the desired circuit characteristics.

Transistor 320, when enabled, operates in parallel with transistor 314 and provides a larger combined N-channel transistor size. When transistor 320 is disabled, only transistor 314 is operational and provides a smaller N-channel transistor size. By selecting the proper sizes for N-channel transistors 314 and 320, many advantages can be obtained.

In operation, a faster slew rate is achieved by enabling transistor 320 prior to a logic high to low (falling) transition at the output of buffer 300. Prior to the falling transition, control transistor 322 is turned "on" since the control signal (Vctrl) is high. Transistor 320 is thus enabled and operates in parallel with transistor 314 to provide a larger N-channel transistor size. Alternatively, transistor 320 is disabled prior to a rising transition at the output of buffer 300. Prior to the rising transition, control transistor 322 is turned "off" since the control signal (Vctrl) is low. Transistor 320 is thus disabled and provides a smaller N-channel transistor size, resulting reduced cross current.

In one implementation, transistor 314 can be designed to be very small, possibly as small as allowed by the minimum design rule for the circuit or as small as required to maintain a logic level at the output (Vout). With the smaller N-channel transistor size, the transition time can be improved during a state change. Additionally, with a N-channel smaller transistor size, the corresponding P-channel transistor size can also be made smaller to achieve an equivalent rise time.

Figure 4:
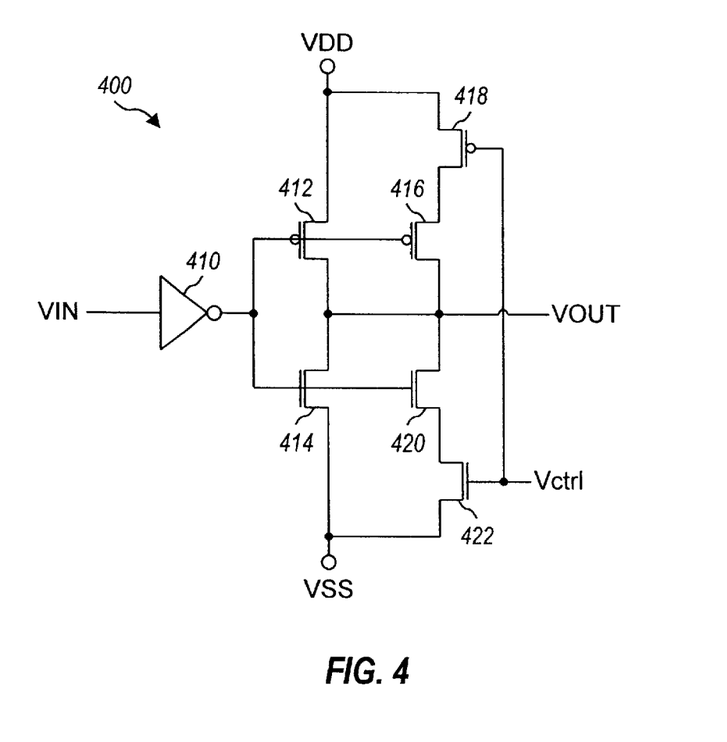
FIG. 4 is a simplified schematic diagram of yet another embodiment of an output buffer of the invention.

FIG. 4 shows a simplified schematic of yet another embodiment of a non-inverting CMOS output buffer 400. Output buffer 400 includes two additional output transistors 416 and 420 that are selectively enabled to provide additional flexibility in the design of the output buffer. Two additional output transistors provide faster slew rate, reduced cross current, and (possibly) faster switching time for both rising and falling transitions.

Output buffer 400 includes an inverting buffer 410 and a pair of output transistors 412 and 414 coupled in series and to supply sources VDD and VSS, respectively. This configuration is similar to that shown in FIG. 1. However, this embodiment provides two additional output transistors, a P-channel transistor 416 having its gate and drain coupled respectively to the gate and drain of transistor 412, and an N-channel transistor 420 having its gate and drain coupled respectively to the gate and drain of transistor 414. The source of transistor 416 couples to the drain of a P-channel control transistor 418, and the source of control transistor 418 couples to the supply source VDD. The source of transistor 420 couples to the drain of an N-channel control transistor 422 and the source of control transistor 422 couples to the supply source VSS. The gates of control transistors 418 and 422 couple together and to a control signal (Vctrl).

Transistors 416 and 420 can be selectively enabled, through the control signal (Vctrl), to provide the desired circuit characteristics. Transistor 416, when enabled, operates in parallel with transistor 412 and provides a larger combined P-channel transistor size. Transistor 420, when enabled, operates in parallel with transistor 414 and provides a larger combined N-channel transistor size. Typically, only transistor 416 or transistor 420 is enabled at any given moment.

When the control signal (Vctrl) is low, control transistor 418 is turned "on" thereby enabling transistor 416, and control transistor 422 is turned "off" thereby disabling transistor 420. The larger combined size of P-channel transistors 412 and 416 provides a faster slew rate during rising transitions. Also, since only N-channel transistor 414 is enabled, cross current is reduced during rising transitions. Alternatively, when the control signal (Vctrl) is high, control transistor 418 is turned "off" thereby disabling transistor 416, and control transistor 422 is turned "on" thereby enabling transistor 420. The larger combined size of N-channel transistors 414 and 420 provide faster slew rate during falling transitions. Since only P-channel transistor 412 is enabled, cross current is also reduced during falling transitions.

Output buffer 400 reduces cross current during both rising and falling transitions. In one implementation, the combined size of P-channel transistors 412 and 416 is equal to, or less than, the size of their counterpart P-channel transistor 112 in FIG. 1. Similarly, in one implementation the combined size of N-channel transistors 414 and 420 is equal to, or less than, the size of their counterpart N-channel transistor 114.

As discussed above, the amount of cross current is dependent on the sizes of the P-channel and N-channel transistors that are actually turned "on". Larger transistor size corresponds to higher beta and greater "on" current. For output buffer 400, since only either transistor 416 or 420 is enabled at any given moment, the cross current is reduced by the transistor that is disabled. For example, prior to a falling transition, transistor 416 is disabled and the cross current is limited to that conducted by transistor 412, even though both N-channel transistors 414 and 420 are enabled. Similarly, prior to a rising transition, transistor 420 is disabled and the cross current is limited to that conducted by transistor 414, even though both P-channel transistors 412 and 416 are enabled. Since transistors 412 and 414 are typically smaller in size than their counterpart transistors 112 and 114, the cross current of output buffer 400 is less than that of output buffer 100 during both rising and falling transitions.

As an example, consider a simplified design where transistor 412 and 416 are each half the size of transistor 112 and transistors 414 and 422 are each half the size of transistor 114. The cross current is thus reduced by half. The amount of cross current reduces approximately linearly with the transistor size because current is proportional to beta ($I \propto \beta$), and beta is proportional to transistor size ($\beta \propto W/L$).

For output buffer 400, the rise time is also faster because P-channel transistors 412 and 416 are sized to pull proportionally less current in N-channel transistor 414. Similarly, the output fall time is faster because N-channel transistor 414 and 420 are sized to pull proportionally less current in P-channel transistor 412.

Figure 5:
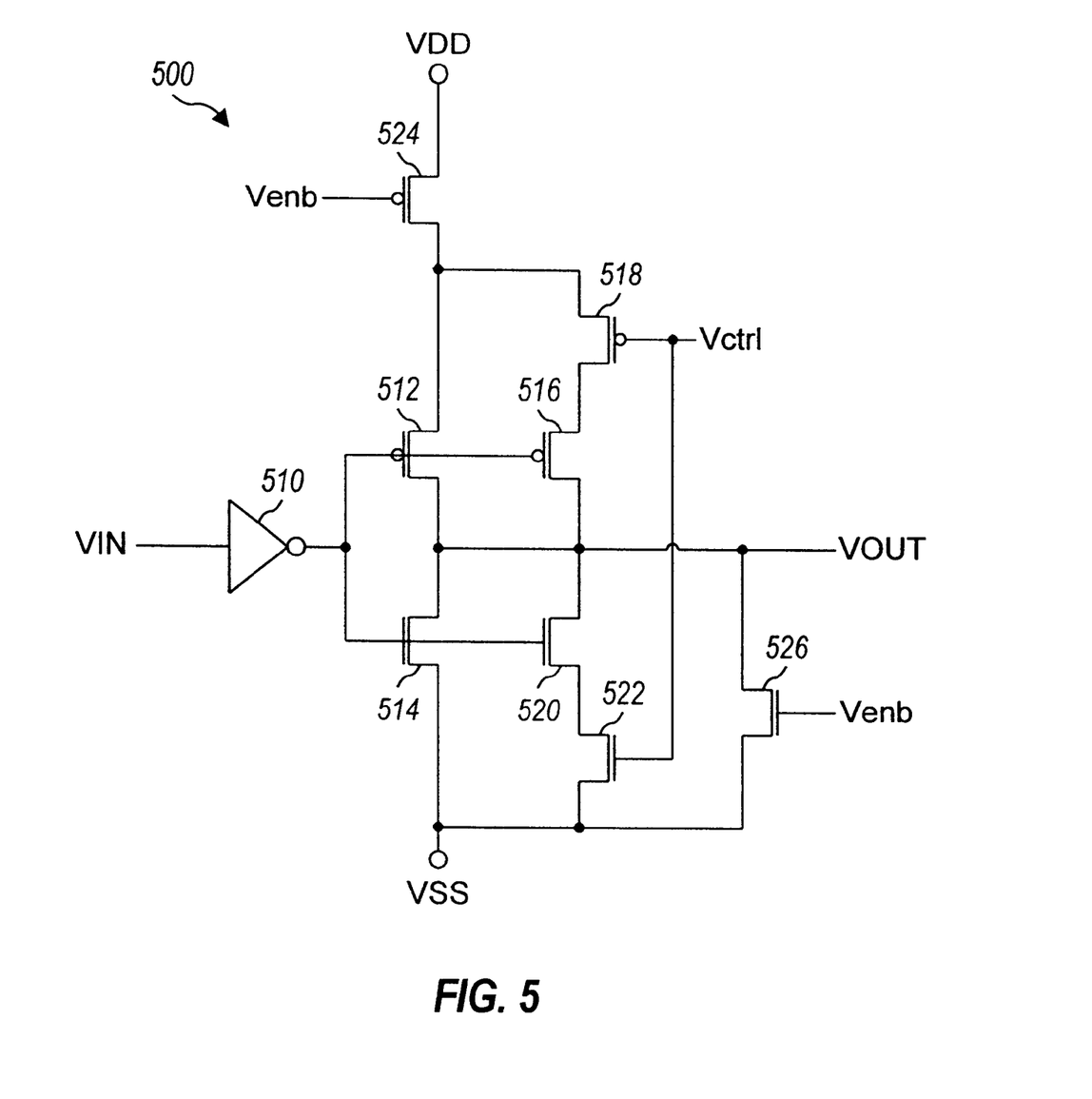
FIG. 5 is a simplified schematic diagram of yet another embodiment of an output buffer of the invention.

FIG. 5 shows a simplified schematic of yet another embodiment of a non-inverting CMOS output buffer 500. Output buffer 500 is similar to output buffer 400 shown in FIG. 4, and includes enable transistors 524 and 526. P-channel enable transistor 524 couples in series with transistors 512 and 514, and N-channel enable transistor 526 couples in parallel with transistor 514. Output buffer 500 also includes two additional output transistors 516 and 520 and operates, when enabled, in similar manner as output buffer 400.

Enable transistors 524 and 526 are used to enable and disable output buffer 500. When the enable signal (Venb) is low, transistor 524 is turned "on" and transistor 526 is turned "off". In this state, output buffer 500 operates in similar manner as described above for output buffer 400. When the enable signal (Venb) is high, transistor 524 is turned "off" and transistor 526 is turned "on". In this state, no current flows through output transistors 512, 514, 516 and 520. The voltage at the output signal (vout) would normally float in a high impedance state, except that transistor 526 is turned "on" and pulls the output signal (Vout) low.

Enable transistor 524 ensures that no (or low leakage) current flows through output buffer 500 when it is disabled, even if the output is floating or changing. This reduces the amount of current consumption during a standby period, and also prevents the input signal (Vin) from propagating to the output of buffer 500. Output buffer 500 can be designed with only enable transistor 524, or only enable transistor 526, or both enable transistors 524 and 526. The particular design is determined by the circuit requirement. The enable signal (Venb) can be coupled, for example, to the chip enable signal.

For a circuit design that requires the output signal (Vout) to be the opposite polarity when disabled (i.e., a high output when not enabled), an "opposite" control circuit can be used. In particular, a P-channel pull-up transistor can be coupled in parallel with transistor 512 and a N-channel transistor can be coupled in series with transistor 514.

In accordance with the invention, selected one of the additional output transistors is enabled prior to specific signal transitions at the buffer output. The enabling of the selected output transistor needs not be performed in a precise manner or at a high switching rate. For CMOS circuits, once a signal reaches a steady state logic value, either the P-channel transistor or the complementary N-channel transistor is turned "off". Thus, no current conducts upon reaching steady state.

Figure 6A:
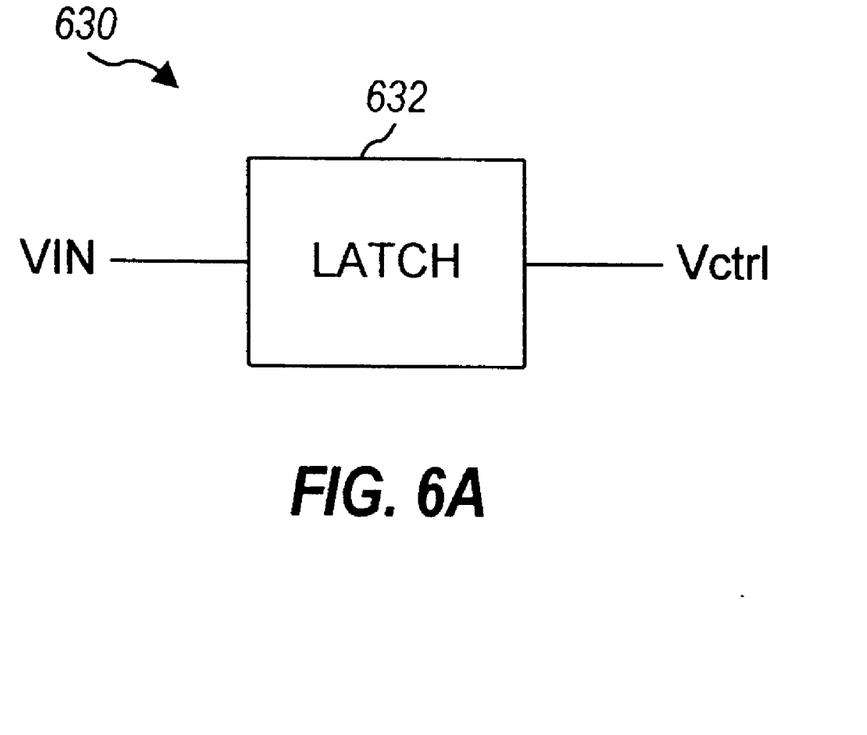
FIGS. 6A–6B are simplified schematic diagrams of two embodiments of a control circuit.

FIG. 6A shows a simplified schematic diagram of one embodiment of a control circuit 630 for generating the control signal (Vctrl). The input signal (Vin), the same signal that is applied to the output buffer, is provided to the inputs of a latch 632. The output of latch 632 comprises the control signal (Vctrl). Latch 632 can be designed as an ordinary "slow" latch.

The operation of control circuit 630 in combination with an output buffer can be described by reference to the embodiment shown in FIG. 2. As described above, P-channel transistor 216 is enabled prior to a rising transition. Also, the control signal (Vctrl) is a delayed version of the input signal (Vin). Thus, after the input signal (Vin) has transitioned from high to low, the control signal (Vctrl) is at logic low and turns "on" control transistor 218. Transistor 216 is enabled and awaits the next rising transition on which it will operate. After the input signal (Vin) has transitioned from low to high, the control signal (Vctrl) is at logic high and turns "off" control transistor 218. Transistor 216 is disabled at the next falling transition in the input signal (Vin).

As described above, the additional output transistor is enabled or disabled shortly after the input signal (Vin) has transitioned. Precise timing is not necessary. Care is used to ensure that the delay between Vctrl and Vin is shorter than the pulse width of the input signal so that the additional output transistor is properly enabled or disabled before the next transition arrives.

Figure 6B:
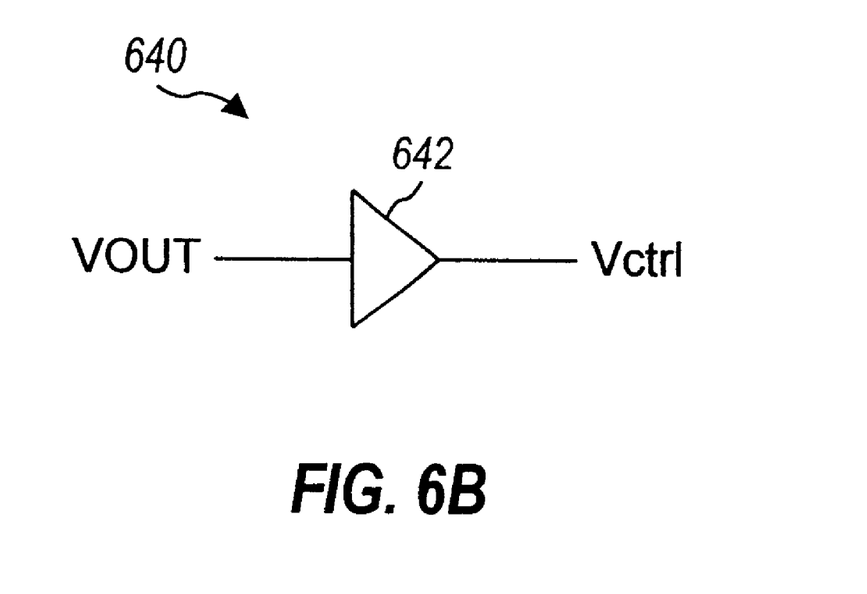

FIG. 6B shows a simplified schematic diagram of another embodiment of a control circuit 640 for generating the control signal (Vctrl). The output signal (Vout), the same signal that is provided by the output buffer, is provided to the input of a buffer 642. The output of buffer 642 comprises the control signal (Vctrl). The control signal (Vctrl) generated by control circuit 640 is a delayed and non-inverted version of the output signal (Vout). In one design, buffer 642 is implemented as two inverters coupled in series.

The output buffer of the invention can be used in any digital logic circuits including microprocessors, controllers, digital signal processors, memory devices, and so on. In particular, the output buffer is especially suited for used in memory devices including random access memory (RAM), read only memory (ROM), erasable programmable read only memory (EPROM), electronically erasable programmable read only memory (EEPROM), FLASH EPROM, and other memory devices.

For clarity, the invention has been described using CMOS logic. However, the inventive concept of dynamic adjustment of the betas of the output transistors to provide the desired operating characteristics can be applied to other logic families such as TTL, ECL, GaAs, and so on. As used herein in its broadest scope, and especially in the claims, "transistor" denotes an active device from any logic families, including bipolar junction transistor (BJT), field effect transistor (FET), gallium arsenide (GaAs) transistors, and the like.

The output buffer of the invention can be used in combination with a logic input buffer having dynamically adjustable betas to provide even more advantages. One such logic input buffer is described in U.S. patent application Ser. No. 09/071,673 entitled "METHOD AND CIRCUIT FOR LOGIC INPUT BUFFER", filed May 1, 1998, assigned to the assignee of the present invention, and incorporated herein by reference.

The foregoing description of specific embodiments is provided to enable any person skilled in the art to make or use the present invention. The various modifications to these embodiments will be readily apparent to those skilled in the art, and the generic principles defined herein may be applied to other embodiments without the use of the inventive faculty. For example, transistor 216 in FIG. 2 can be enabled during falling transitions (i.e., to slow down the rise time). Furthermore, two or more dissipation devices can be placed between lasers to provide additional control. Thus, the present invention is not intended to be limited to the embodiments shown herein but is to be accorded the widest scope consistent with the principles and novel features disclosed herein, and as defined by the following claims.

What is claimed is:

1. A logic output buffer comprising:
   a P-channel output transistor coupled to an output of the buffer;
   an N-channel output transistor coupled in series with the P-channel output transistor and further to the buffer output;
   an additional output transistor coupled in parallel with either the P-channel output transistor or the N-channel output transistor and further to the buffer output;
   a control transistor coupled in series with the additional output transistor, wherein the control transistor enables the additional output transistor prior to falling transitions at the buffer output if the additional output transistor is an N-channel transistor coupled in parallel with the N-channel output transistor, and wherein the control transistor enables the additional output transistor prior to rising transitions at the buffer output if the additional output transistor is a P-channel transistor coupled in parallel with the P-channel output transistor; and a control circuit coupled to an input of the buffer and the control transistor and operative to provide a control signal for the control transistor.

2. The buffer of claim 1 wherein the additional output transistor is a P-channel transistor that is coupled in parallel with the P-channel output transistor.

3. The buffer of claim 2, further comprising:

an additional N-channel output transistor coupled in parallel with the N-channel output transistor.

4. The buffer of claim 1, wherein the additional output transistor is operative to provide additional signal drive for the buffer output.

5. The buffer of claim 1 wherein the additional output transistor is an N-channel transistor that is coupled in parallel with the N-channel output transistor.

6. The buffer of claim 5, further comprising:

an additional P-channel output transistor coupled in parallel with the P-channel output transistor.

7. The buffer of claim 1 wherein transistor sizes of the P-channel output transistor, the N-channel output transistor, and the additional output transistor are dimensioned to provide faster slew rate.

8. The buffer of claim 1 wherein transistor sizes of the P-channel output transistor, the N-channel output transistor, and the additional output transistor are dimensioned to provide reduced cross current during signal transitions.

9. The buffer of claim 1 wherein transistor sizes of the P-channel output transistor, the N-channel output transistor, and the additional output transistor are dimensioned to provide faster rise or fall time.

10. The buffer of claim 1 wherein the size of the additional output transistor is similar in dimension to that of the output transistor to which it couples in parallel.

11. A logic output buffer comprising:

a P-channel output transistor;

an N-channel output transistor coupled in series with the P-channel output transistor;

an additional output transistor coupled in parallel with either the P-channel output transistor or the N-channel output transistor;

a control transistor coupled in series with the additional output transistor; and a latch operatively coupled to an input signal and the control transistor, and wherein the additional output transistor is enabled prior to selective ones of rising and falling transitions of an output signal.

12. The buffer of claim 1, wherein the control circuit comprises a latch.

13. The buffer of claim 1, wherein the control circuit comprises a delay element.

14. The buffer of claim 1 further comprising:

an enable transistor coupled in series with the output transistors.

15. A logic output buffer comprising:

a P-channel output transistor;

an N-channel output transistor coupled in series with the P-channel output transistor;

an additional output transistor coupled in parallel with either the P-channel output transistor or the N-channel output transistor;

a control transistor coupled in series with the additional output transistor;

a first enable transistor coupled in series with the output transistors; and a second enable transistor coupled in parallel with the N-channel output transistor, and wherein the additional output transistor is enabled prior to selective ones of rising and falling transitions of an output signal.

16. A logic output buffer comprising:

a P-channel output transistor coupled to an output of the buffer;

an N-channel output transistor coupled in series with the P-channel output transistor and further to the buffer output;

an additional P-channel output transistor coupled in parallel with the P-channel output transistor and further to the buffer output;

an additional N-channel output transistor coupled in parallel with the N-channel output transistor and further to the buffer output;

a first control transistor coupled in series with the additional P-channel output transistor, wherein the first control transistor enables the additional P-channel transistor prior to rising transitions at the buffer output;

a second control transistor coupled in series with the additional N-channel output transistor, and wherein the second control transistor enables the additional N-channel output transistor prior to falling transitions at the buffer output; and a control circuit coupled to an input of the buffer and the first and second control transistors and operative to provide one or more control signals for the control transistors.

17. The buffer of claim 16, further comprising:

an enable transistor coupled in series with the P-channel and N-channel output transistors.

18. The buffer of claim 16, wherein the additional N-channel and P-channel output transistors are operative to provide additional signal drive for the buffer output.

19. The buffer of claim 16, wherein the control circuit comprises a latch.

20. A logic output buffer comprising:

a first output transistor coupled to an output of the buffer;

a second output transistor coupled in series with the first output transistor and further to the buffer output;

a third output transistor coupled in parallel with either the first or second output transistor and further to the buffer output;

a control transistor coupled in series with the third output transistor, and wherein the control transistor enables the third output transistor prior to falling transitions at the buffer output if the third transistor is coupled in parallel with the first output transistors, and wherein the control transistor enables the third output transistor prior to rising transitions at the buffer output if the third output transistor is coupled in parallel with the second output transistors; and a control circuit coupled to an input of the buffer and the control transistor and operative to provide a control signal for the control transistor.

21. The buffer of claim 20, wherein the control circuit is a latch.

22. A method for dynamically adjusting output operating characteristics of a logic output buffer comprising:

receiving an input signal at an input of the output buffer;

generating a control signal based on the received input signal;

adjusting beta of at least one output transistor within the output buffer in accordance with the control signal, wherein the beta is adjusted to provide either a larger sourcing current drive for rising transitions at an output of the output buffer or a larger sinking current drive for falling transitions at the output of the output buffer; and driving the output of the output buffer with the at least one beta adjusted output transistor to provide the dynamically adjusted output operating characteristics.

23. The buffer of claim 11, wherein the additional output transistor is a P-channel transistor that is coupled in parallel with the P-channel output transistor.

24. The buffer of claim 23, wherein the additional output transistor is enabled prior to rising transitions of the output signal.

25. The buffer of claim 11, wherein the additional output transistor is an N-channel transistor that is coupled in parallel with the N-channel output transistor.

26. The buffer of claim 25, wherein the additional output transistor is enabled prior to falling transitions of the output signal.

27. The buffer of claim 11, wherein the additional output transistor is operative to provide additional signal drive for the buffer output.

28. The buffer of claim 11, further comprising:

an enable transistor coupled in series with the P-channel and N-channel output transistors.

29. A dynamic random access memory (DRAM) comprising the buffer of claim 17.

* * * * *